(12) United States Patent
Wennekers et al.

(10) Patent No.: US 8,289,094 B2
(45) Date of Patent: Oct. 16, 2012

(54) VOLTAGE CONTROLLED OSCILLATOR (VCO) CIRCUIT WITH INTEGRATED COMPENSATION OF THERMALLY CAUSED FREQUENCY DRIFT

(75) Inventors: Peter Wennekers, Hergolding (DE); Hao Li, Munich (DE); Yi Yin, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/997,102

(22) PCT Filed: Jun. 26, 2008

(86) PCT No.: PCT/IB2008/052579
§ 371 (c)(1),
(2), (4) Date: Dec. 9, 2010

(87) PCT Pub. No.: WO2009/156793
PCT Pub. Date: Dec. 30, 2009

(65) Prior Publication Data
US 2011/0128080 A1    Jun. 2, 2011

(51) Int. Cl.
*H03B 5/08* (2006.01)
(52) U.S. Cl. ............. 331/167; 331/177 V; 331/117 R; 331/117 FE
(58) Field of Classification Search ............. 331/177 V, 331/176, 167, 117 R, 117 FE
See application file for complete search history.

(56) References Cited

U.S. PATENT DOCUMENTS

| | | | |
|---|---|---|---|
| 4,270,102 A | 5/1981 | Gawler et al. | |
| 4,833,426 A | 5/1989 | Robichom et al. | |
| 4,978,930 A | 12/1990 | Suter | |
| 5,151,667 A | 9/1992 | Nishijima | |
| 5,654,669 A * | 8/1997 | Uhling et al. | 330/51 |
| 6,043,720 A | 3/2000 | Van Veenendaal et al. | |
| 6,052,036 A | 4/2000 | Enstrom et al. | |
| 7,164,325 B2 * | 1/2007 | Aparin et al. | 331/176 |
| 7,463,097 B2 * | 12/2008 | Costa et al. | 331/14 |
| 7,602,259 B2 * | 10/2009 | Matsuzuka et al. | 331/176 |
| 7,978,017 B2 * | 7/2011 | Pernia et al. | 331/167 |
| 2004/0189417 A1 | 9/2004 | Fujita | |
| 2005/0128017 A1 | 6/2005 | Meltzer | |
| 2006/0017519 A1 | 1/2006 | Pernia et al. | |

FOREIGN PATENT DOCUMENTS
EP    0580209 A1    1/1994

OTHER PUBLICATIONS

International Search Report and Written Opinion correlating to PCT/IB2008/052579 dated Mar. 11, 2009.

* cited by examiner

*Primary Examiner* — Arnold Kinkead

(57) ABSTRACT

A voltage controlled oscillator circuit comprises a VCO resonator circuit having a first plurality of varactors for varying a frequency of the VCO resonator circuit, the VCO resonator circuit being symmetrical with respect to VCO circuit ground and providing a signal having a frequency, the frequency depending on a tuning voltage applied to the first plurality of varactors, and a second plurality of varactors for compensating a drift of the frequency depending on a compensation voltage, a temperature sensor circuit sensing an ambient temperature of the VCO resonator circuit and providing a temperature dependent signal, and a temperature compensation circuit providing the compensation voltage depending on the temperature dependent signal. Furthermore, a phase locked loop (PLL) circuit, an automotive radar device and a method for compensating a frequency drift of a VCO resonator circuit are presented.

15 Claims, 6 Drawing Sheets

VOLTAGE CONTROLLED OSCILLATOR (VCO) CIRCUIT WITH INTEGRATED COMPENSATION OF THERMALLY CAUSED FREQUENCY DRIFT

FIELD OF THE INVENTION

This invention relates to electronic devices, and more specifically to a voltage controlled oscillator (VCO) circuit with an integrated compensation of a thermally caused frequency drift.

BACKGROUND OF THE INVENTION

A voltage controlled oscillator or VCO is an electronic oscillator designed to be controlled in oscillation frequency by a voltage input, i.e. the frequency of oscillation can be varied by the applied tuning voltage. However, an unwanted drift of oscillation frequency can be observed due to a temperature dependent variation of physical parameters of the device. For example, the performance of a VCO being integrated on Silicon (Si) substrate is affected by the temperature of the substrate. A VCO designed for Giga-Hertz operation has all components which determine the oscillation frequency integrated on the substrate. The electrical parameters of the components and the mechanical chip dimensions vary with temperature. When the VCO chip temperature is increased—either by operating in a hot environment or by self-heating caused by dissipated power of the circuit—the oscillation frequency changes. If the frequency of operation is comparably low (about 2 GHz, for example), a VCO resonator, i.e. the VCO oscillator core, may contain a lumped inductor, which is comprised of a coil made by the metal layers of the semiconductor process. At higher frequency (>15 GHz, for example), a VCO resonator is realized with transmission lines (TL) located on chip. The length of the TL influences the frequency of operation. When the VCO chip is heated up, the mechanical dimensions of the TL increase according to the thermal expansion coefficient of the substrate. As a consequence, the frequency of operation of the VCO is shifted to a lower value.

This effect can be quite substantial, if a VCO being implemented with integrated TLs is operated at millimeter wave frequency. A measured example is shown in FIG. 1: A state-of-the-art VCO circuit with microstrip TLs on Si-substrate oscillating at 77.0 GHz at 25° C. experiences a drift of approximately 2.0 GHz towards lower frequency when being heated up to 125° C. Besides a variation of the mechanical device dimensions, other physical parameters of a VCO might be subject to a change caused by a change of the ambient temperature. For example, if a VCO core is implemented using bipolar transistor technology, the capacitance of the collector base diodes changes with temperature, causing a frequency drift of the VCO. Resistors used in the VCO core change their resistance values depending on temperature, therefore influencing a drift of the VCO frequency. Furthermore, the loop gain of a VCO may be subject to change, since the transit time of a transistor, for example a heterojunction bipolar transistor (HBT) that can handle signals of very high frequencies, decreases with increasing temperature, causing a reduced frequency of the VCO.

The temperature drift of integrated VCOs is a known issue. For example, the document EP 0 580 209 A1 describes a low-gain, range programmable, temperature compensated voltage controlled oscillator, wherein a VCO must be contained in a phase locked loop. The oscillator signal is made substantially temperature-independent by requiring a temperature-independent constant current source providing a fixed current through a variable resistance and a temperature dependent current which sinks and sources additional current to the oscillator as temperature rises and falls. The document U.S. Pat. No. 6,043,720 describes an oscillator architecture and a temperature compensation circuit with a frequency drift compensation based on varying various different biasing parameters. No integrated varactors are used. The document U.S. Pat. No. 6,052,036 describes a crystal oscillator with automatic gain control and on-chip tuning. A fixed frequency oscillator employing a crystal and using a PTAT circuit (PTAT: Proportional to Absolute Temperature) for temperature compensation is provided. However, PTAT circuits allow for compensation of a linear variation of a voltage over temperature. The influence of second order non-linear terms, which play a significant role when a desired temperature coefficient of a compensation voltage is supposed to be very low, is not compensated sufficiently. The document U.S. Pat. No. 5,151,667 shows a temperature compensated non-symmetrical oscillation circuit without employing varactors for a compensation. The document U.S. Pat. No. 4,270,102 provides another non-symmetrical oscillation circuit with a temperature compensation. The document U.S. Pat. No. 4,978,930 describes a VCO temperature compensation circuit based on a PTAT current source. The VCO is provided with a temperature dependent offset for the tuning voltage. However, the attachment of the temperature compensation circuit to the VCO resonator degrades the phase noise of the oscillator. The document U.S. Pat. No. 4,833,426 describes a temperature compensated piezoelectric oscillator requiring thermistors. Hence, components not suitable for the implementation of an integrated VCO operating at high frequencies are required.

SUMMARY OF THE INVENTION

The present invention provides a voltage controlled oscillator (VCO) circuit with an integrated compensation of thermally caused frequency drift, a compensating method, a phase locked loop circuit, and an automotive radar device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 2:
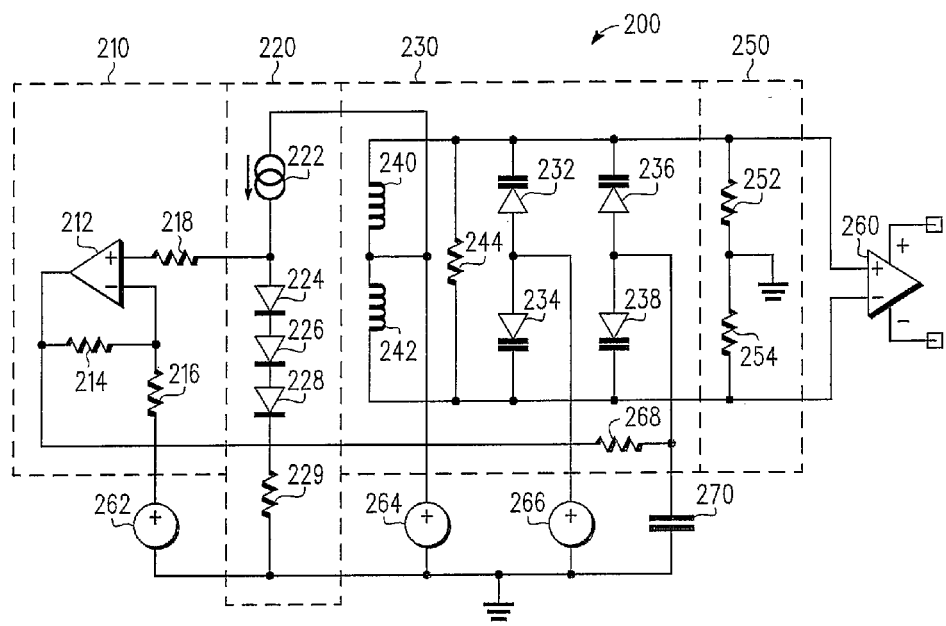
FIG. 2 schematically shows a functional diagram of an example of a first embodiment of a temperature compensated VCO circuit.

Referring to FIG. 2, a functional diagram of an example of a first embodiment of a temperature compensated voltage controlled oscillator (VCO) circuit 200 shows four main building blocks, a temperature compensation block 210, a temperature sensor block 220, a VCO resonator block 230, and a negative impedance block 250, providing an output signal to an output buffer 260. The shown VCO circuit 200 comprises a VCO resonator circuit 230 having a first plurality of varactors 232, 234 for varying a frequency of the VCO resonator circuit 230, the VCO resonator circuit being symmetrical with respect to VCO circuit ground and providing a signal having a frequency, the frequency depending on a tuning voltage $V_{tune}$ applied to the first plurality of varactors 232, 234, and a second plurality of varactors 236, 238 for compensating a drift of the frequency depending on a compensation voltage $V_{comp}$, temperature sensor circuit 220 sensing an ambient temperature of the VCO resonator circuit 230 and providing a temperature dependent signal $V_{temp}$, and a temperature compensation circuit 210 providing the compensation voltage depending on the temperature dependent signal.

Besides the above mentioned first 232, 234 and second 236, 238 plurality of varactors or variable capacitances, the shown VCO resonator circuit 230 comprises inductive components 240, 242 symmetrical to circuit ground. For higher frequencies, or radio frequencies (RF), impedance values of inductive and capacitive components can be realized using TLs. A symmetrical resonator has the advantage, that voltages of circuit nodes along the line of symmetry stay constant vs. time. Thus, these nodes behave as virtual RF-ground. Applying bias voltages to the nodes of symmetry can easily be done without loading the resonator. When applying bias voltages to the circuit, no additional components blocking the RF frequencies (i.e. RF chokes) are needed.

As shown in FIG. 2, a resistive loss of the VCO resonator circuit 230 may be at least partly compensated using a negative impedance stage 250, avoiding compensation with a feedback loop, that suffers, for example, from long signal propagation delay, when being used with Giga-Hertz operation frequencies. The negative impedance stage 250 is attached to the resonator 230, comprising a plurality of negative impedance components 252, 254 symmetrical to circuit ground. The provided negative impedance in the frequency range of interest compensates for resistive losses of the resonator 230, which are symbolized by resistor 244. The voltage swing across the resonator is sensed by an output buffer 260, which delivers the oscillator signal to external loads. The frequency of operation of the oscillator can be tuned by varying tuning voltage $V_{tune}$ provided by a tuning voltage supply 266 and applied to the first set of varactors 232, 234. Additionally, the VCO frequency can also be controlled by a compensation voltage $V_{comp}$, which is applied to the second set of varactors 236, 238.

The compensation voltage $V_{comp}$ is generated by a temperature compensation circuit 210 and provided to the second set of varactors 236, 238 after passing a low pass filter 268, 270 reducing unwanted noise. The temperature compensation circuit 210 may comprises at least one operational amplifier 212. It further comprises resistors ($R_1$, $R_2$) 214, 216, wiring amplifier 212 to be non-inverting. The compensation circuit or compensating amplifier 210 provides an output voltage that drives the second set of varactors 232, 234. In order to adjust the bias point of the second set of varactors 236, 238, the compensation voltage $V_{comp}$ is adjusted by a reference voltage $V_{ref}$ provided by a voltage supply 262. Compensation voltage $V_{comp}$ is generated with respect to an input voltage $V_{temp}$ applied to the positive input terminal of amplifier 212 via resistor 218. $V_{temp}$ is an output voltage of temperature sensor 220 sensing an ambient temperature. The temperature sensor circuit may comprise a current source generating a current through at least one diode 224, 226, 228 and a resistor 229. The voltage across a junction of the used diode depends on the ambient temperature. Using more than one identical diodes in a serial connection will shift the voltage change to a required voltage range. In FIG. 2, diodes 224, 226, 228 are used for generating a temperature dependent voltage. However, any semiconducting device with a temperature dependent junction may be used, e.g. a diode connected transistor.

The VCO resonator circuit 230 and the temperature sensor circuit 220 may be subject to the same temperature changes. Hence, output voltage $V_{temp}$ can be used as an input voltage of the compensation circuit 210, allowing to generate a temperature compensation voltage for the resonator circuit 230.

In order to provide all components of the VCO circuit with the same temperature and to reduce additional influences, the VCO resonator circuit 230, the temperature sensor circuit 220 and the temperature compensation circuit 210 may be provided as a monolithically integrated circuit built on the same chip.

The shown VCO circuit 200 compensates its temperature dependent frequency drift:

When the chip temperature increases, the voltage $V_{temp}$ decreases, as the voltage drop $V_d$ across each diode 224, 226, 228, when being driven by a constant current $I_d$ provided by current source 222, is a linear function of absolute temperature T:

$$V_d = kT/q \cdot \ln I_d \qquad \text{(eq. 1)}$$

where q is the magnitude of the electrical charge (in coulombs) on the electron, and k the Boltzmann constant.

$V_{temp}$ is applied to a positive input terminal of operational amplifier (OPAMP) 212 of compensation circuit 210. The transfer function of OPAMP 212 wired by R1 and R2 to be non-inverting is given by $$V_{comp} = (1+R_1/R_2) \cdot V_{temp} + R_1/R_2 \cdot V_{ref} \qquad \text{(eq. 2)}$$

Thus the gain G of the compensation circuit 210 with respect to $V_{temp}$ is given by $$G := dV_{comp}/dV_{temp} = 1 + R_1/R_2 \qquad \text{(eq. 3)}$$

As the temperature dependent drift of VCO frequency $df_{vco}/dT$ is negative, i.e. frequency $f_{vco}$ decreases with increasing temperature, the compensation voltage $V_{comp}$ needs to be lowered to increase the reverse bias voltage of the second set of varactors 232, 234. Increasing the reverse bias voltage will lower varactor capacitance, and therefore increase the frequency of oscillation $f_{vco}$.

Temperature compensation can be achieved with a linear compensating amplifier as shown in FIG. 2, if it can be assumed that the VCO frequency varies linearly with respect to temperature and that the frequency drift is independent of the actual level of compensation voltage $V_{comp}$. Therefore, the variation of VCO frequency $\Delta f_{vco}$ depends on the variation of temperature T and voltage $V_{comp}$:

$$\Delta f_{vco} = \delta f_{vco}/\delta V_{comp}|_{T=const.} + \delta f_{vco}/\delta T|_{Vcomp=const.} \quad \text{(eq. 4)}$$

Compensation is achieved, when $$\delta f_{vco} \delta V_{comp}|_{T=const.} = -\delta F_{vco} \delta T|_{Vcomp=const.} \quad \text{(eq. 5)}$$

The term $\delta f_{vco}/\delta T|_{Vcomp=const.}$ can be measured at a given voltage $V_{comp}$. Typically, $V_{comp}$ is set to the center value of the tuning voltage range and $f_{vco}$ vs. temperature T is measured.

The amplifier gain required to generate voltage $V_{comp}$ delivered to the second set of varactors 236, 238 that keeps the oscillating frequency $f_{vco}$ constant with respect to the temperature change on chip can be calculated. The necessary gain can be calculated from eq. 3 and eq. 5:

With $$\delta f_{vco}/\delta V_{comp.} = \delta f_{vco}/\delta T/\cdot \delta T/\delta V_{comp} = \delta f_{vco}/\delta T \cdot \delta T/ (G \cdot \delta V_{temp}) = 1/G \cdot \delta f_{vco}/\delta V_{temp} \quad \text{(eq. 6)}$$

the gain G has to be $$G = (\delta f_{vco}/\delta V_{temp})/(\delta f_{vco}/\delta V_{comp.}) \quad \text{(eq. 7)}$$

As the output voltage $V_{temp}$ of the temperature sensor is a linear function of chip temperature, eq. 7 can be written as $$G = K_s(\delta f_{vco}/\delta T)/(\delta f_{vco}/\delta V_{comp.}) \quad \text{(eq. 8)}$$

The temperature sensitivity factor $K_s$ depends on the actual implementation of the temperature sensor circuit. With of $\delta f_{vco}/\delta T$ being available from measurement and VCO tuning sensitivity of $\delta f_{vco}/\delta V_{comp.}$, sensitivity factor $K_s$ from circuit simulation results—the gain G can be determined from eq. 8, and with eq. 3, the ratio of resistances $R_1$ and $R_2$ is determined.

Figure 3:
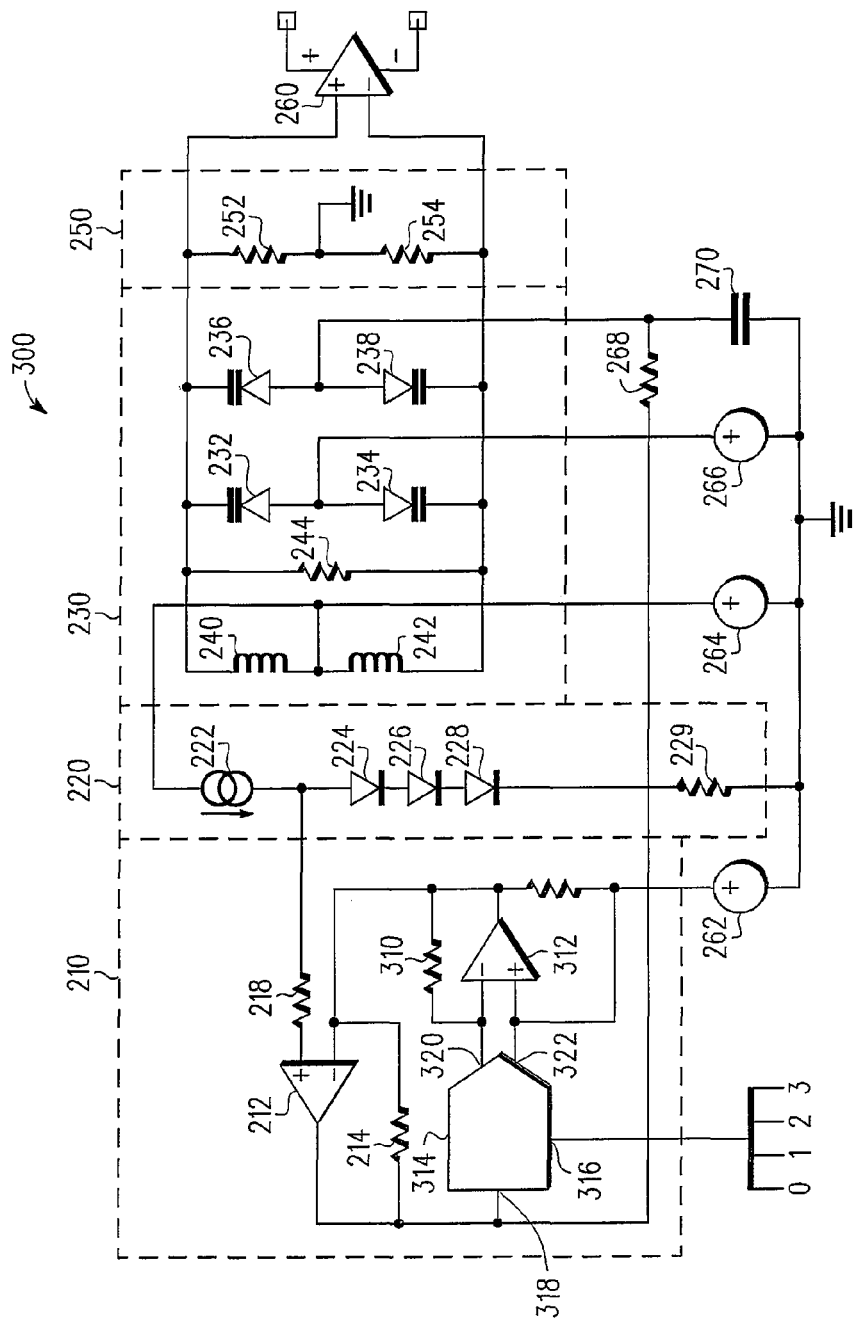
FIG. 3 schematically shows a functional diagram of an example of a second embodiment of a temperature compensated VCO circuit.

Referring now to FIG. 3, a functional diagram of an example of a second embodiment of a temperature compensated VCO circuit 300 is shown. Only components differing from the circuit shown in FIG. 2 are explained. This embodiment may comprise a temperature compensation circuit 210, which has a programmable gain. The gain can be varied by modifying the value of resistors 214 ($R_1$) and/or 216 ($R_2$). Therefore, the temperature compensation circuit 210 may comprise at least one multiplying digital-to-analog converter (MDAC) 314. The MDAC may be connected in a feedback path of a second operational amplifier (312) circuit. A programmable current bypass comprising an MDAC 314, an OPAMP 312, and a resistor 310 (R) is connected in parallel with resistor 214 ($R_1$). The MDAC 314, having a reference voltage input 318 and outputs 320, 322, in conjunction with OPAMP 312 and feedback resistor 310 (R) can be considered as a programmable resistor having a resistance value R(n) =R·N/n, with N being the number of data bits of the MDAC 314 and n being the actual value of a specific data bit setting provided to the MDAC 314 via data bits terminal 316. Resistor 310 (R) has the same value as the basic resistor R of a R-2R ladder of the MDAC 314. As R(n) is connected in parallel with resistor 214 ($R_1$), the programmable gain is given by $$G = 1 + R_1 \cdot R(n)/(R_2 \cdot (R_1 + R(n))) \quad \text{(eq. 9)}$$

A compensating amplifier with a programmable gain has the advantage, that temperature compensation can be adjusted during operation of the circuit. Thus, operational performance of individual chips can be optimized and deviations due to, for example, chip aging can be corrected.

Figure 4:
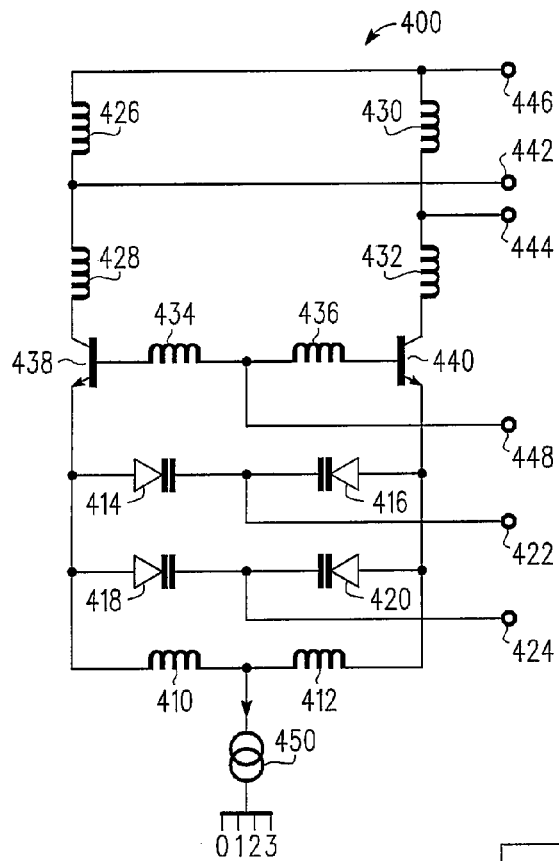
FIG. 4 schematically shows a functional diagram of an example of an embodiment of a VCO resonator circuit.

Referring now to FIG. 4, a schematic diagram of an example of a symmetrical VCO resonator core implementation 400 is shown, comprising an RF choke 410, 412, a first set of varactors 414, 416 with a terminal 422 for applying a tuning voltage $V_{tune}$, a second set of varactors 418, 420 with a terminal 424 for applying a temperature compensation voltage $V_{comp}$, a set of inductors 426-436 and transistors 438-440, terminals 442, 444 for delivering an output RF voltage to an output buffer, an input terminal 446 for supplying an input voltage to the circuit, an oscillation current source 450, and a terminal 448 for supplying a bias voltage to inductors 434, 436. The shown embodiment of a VCO resonator circuit expects the potential at terminals 422 and 424 to be kept higher than the potential at the emitter terminals of transistors 438 and 440, in order to have diode devices 410-416 reverse-biased all the time for varactor usage. When implementing the circuit 400 for microwave or millimeter-wave frequencies, the inductance is implemented using microstrip transmission lines. Varactors may be implemented employing collector-base junctions of bipolar transistors. One set is used for frequency sweeping the other for compensating the frequency drift. Active devices (e.g. bipolar or MOS transistors) may also be used for realizing negative impedance values for the resonator.

Figure 5:
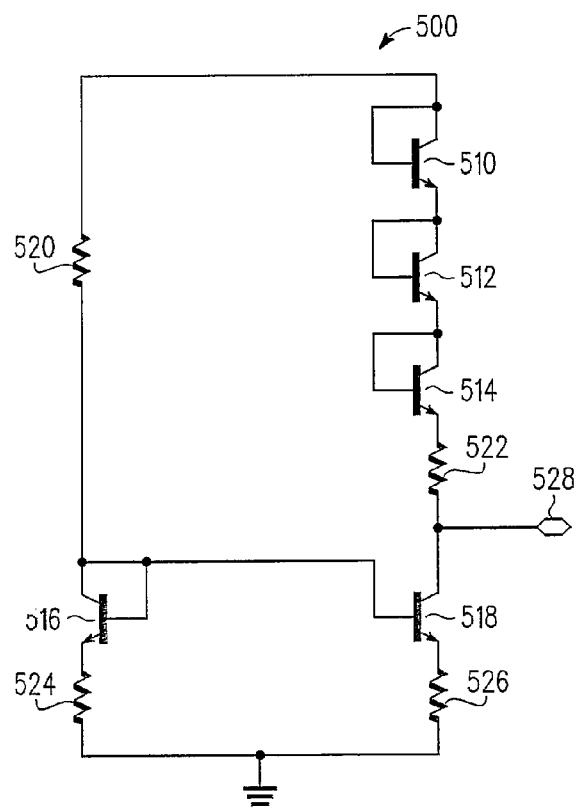
FIG. 5 schematically shows a functional diagram of an example of an embodiment of a temperature sensor circuit.

Referring now to FIG. 5, an example of an embodiment of a temperature sensor circuit 500 comprising a current mirror made of transistors 516, 518 and resistors 520-526 and a stack of 3 diodes 510-514 is used in the temperature sensor to increase temperature sensitivity. The number of diodes connected in serial is chosen with respect to the actual implementation of the circuit. For example, if supply voltage 264 is chosen to be 5 V, three diodes connected in serial, each having a PN-junction voltage drop about 0.8 V, will provide a $V_{temp}$ about 2.4 V, i.e. about half of $V_{supply}$. A current mirror 516, 518 provides a constant current bias. Output terminal 528 delivers the temperature sensitive voltage $V_{temp}$. Diodes 510-514 may be implemented as collector-base diodes of bipolar transistors, and all transistors used in the temperature compensation circuit may be NPN-transistors.

Figure 6:
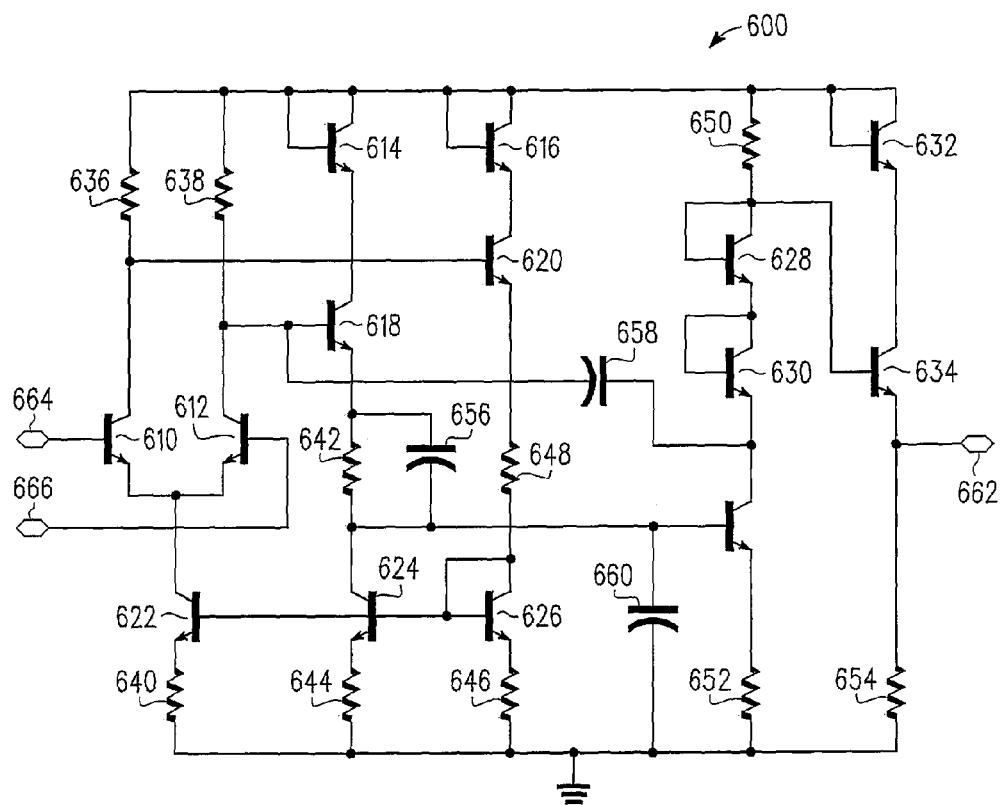
FIG. 6 schematically shows a functional diagram of an example of an embodiment of an operational amplifier.

Referring now to FIG. 6, an example of an embodiment of an OPAMP used in a temperature compensation circuit according to FIG. 2 or FIG. 3, having an output terminal 634 and a positive 666 and a negative 664 voltage input, implemented with resistors 636-654, capacitors 656-660 and NPN bipolar transistors 610-634, is presented, i.e. operational amplifier 600 may comprise transistors 636-654 built as NPN-transistors only. Implementing all transistors as NPN transistors simplifies chip production and enhances production yield. The differential-single ended conversion is achieved with a voltage controlled current mirror 620, 624, 626.

Figure 7:
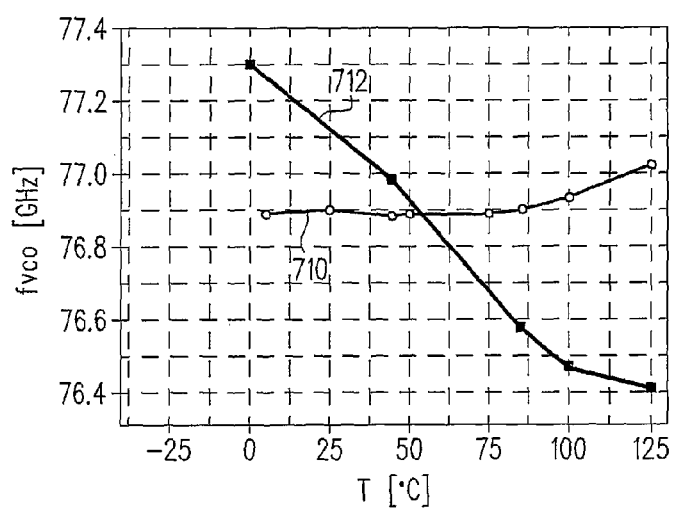
FIG. 7 schematically shows a diagram illustrating an example of a comparison of a VCO frequency with and without an integrated temperature compensation.

Referring now to FIG. 7, a diagram illustrating an example of a comparison of a VCO frequency $f_{VCO}$ with 710 and without 712 an integrated temperature compensation according to the circuit shown in FIG. 2 is presented. It can be seen that a temperature compensation is achieved within a temperature range of +5° C. to 125° C. Furthermore, it can be seen, that the temperature compensated VCO shows virtually no drift between 5° C. and 85° C. At higher temperature the compensation is less precise, but the overall frequency drift is reduced from 900 MHz to 120 MHz.

The shown concept is suitable for all frequency ranges. However, the VCO circuit may be operable in a frequency range above 15 GHz, to be used, for example in a radar device.

Figure 8:
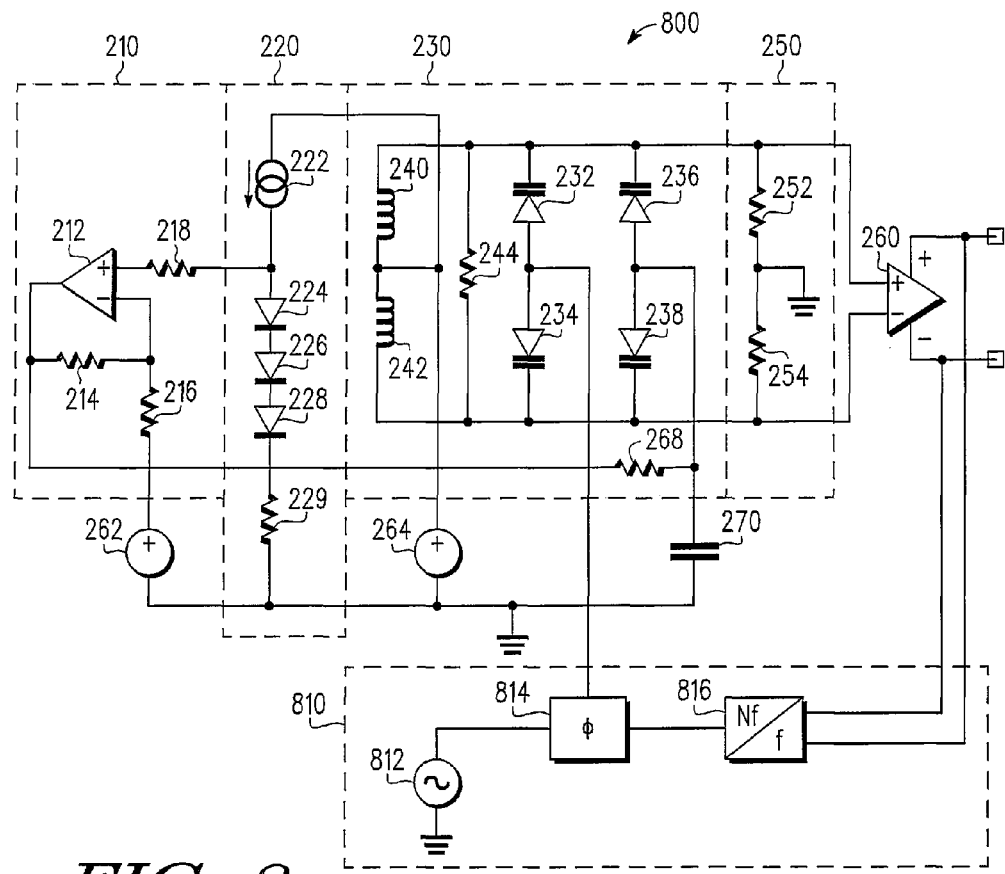
FIG. 8 schematically shows a diagram of an automotive radar device comprising a phase locked loop (PLL) circuit controlling a temperature compensated VCO circuit.

Referring now to FIG. 8, a schematic diagram of an automotive radar device 800 comprising a phase locked loop (PLL) circuit 810 controlling a temperature compensated VCO circuit according to FIG. 2 or FIG. 3, a signal generator 812 providing a reference frequency, a loop filter 814 and a frequency divider 816 is provided.

A standard approach for adjusting the frequency drift vs. temperature of a VCO is to run the VCO within a PLL circuit. This circuit may be used, if sweeping the VCO frequency in a linear way is required, for example in a FMCW radar application device (FMCW: frequency modulated continuous wave). Though a temperature compensation circuit may deem to be not necessary, there is an inherent advantage for using temperature compensation, even when a PLL is used. Therefore, an automotive radar device may comprise a VCO circuit or a PLL system controlling a temperature compensated VCO circuit as described above.

Figure 9:
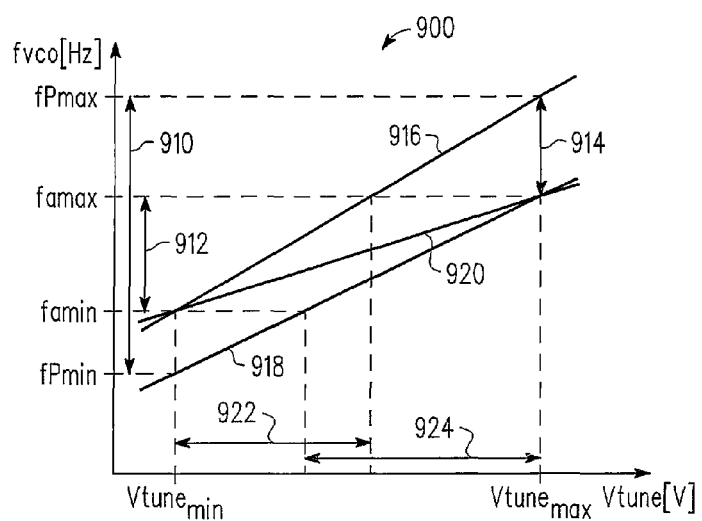
FIG. 9 schematically shows a diagram of an example of a tuning characteristic of a PLL-controlled VCO with and without temperature compensation.

Referring to FIG. 9, a schematic diagram 900 of an example of a oscillation frequency $f_{VCO}$ vs. tuning voltage $V_{tune}$ characteristic of a PLL-controlled VCO with 920 and without 916, 918 temperature compensation is shown. Plot 916 illustrates $f_{VCO}$ vs. $V_{tune}$ for a minimum temperature, 918 for a maximum temperature. Due to the VCO frequency drift vs. temperature 914, a PLL tuning range 910 ($fp_{max}-fp_{min}$) has to be substantially larger than a frequency range 912 of the application ($fa_{max}-fa_{min}$). Thus, tuning sensitivity $K_o$ of a not-temperature compensated VCO defined to be $$K_o := (fp_{max}-fp_{min})/(Vtune_{min}-Vtune_{max}) \qquad \text{(eq. 10)}$$

has to be larger than being required by the application.

The tuning voltage range actually required by the application at minimum temperature 922 and maximum temperature 924 is substantially smaller than $Vtune_{min}-Vtune_{max}$.

A phase-noise spectral density L(f) of a VCO being locked by a PLL depends on the VCO tuning sensitivity and the relation $L(f) \sim K_o^2$ is valid (cf. U. L. Rhode, Microwave and Wireless Synthesizers, Theory and Design Book, Wiley, 1997). Thus, a higher VCO tuning sensitivity yields more phase noise. In a temperature compensated VCO, the PLL frequency span can be close to the frequency span of the application. Thus, the VCO phase noise is substantially reduced because of lower tuning sensitivity needed. Hence, the implementation of a temperature compensated VCO locked by a PLL provides a reduce phase noise and therefore more design margin.

Figure 10:
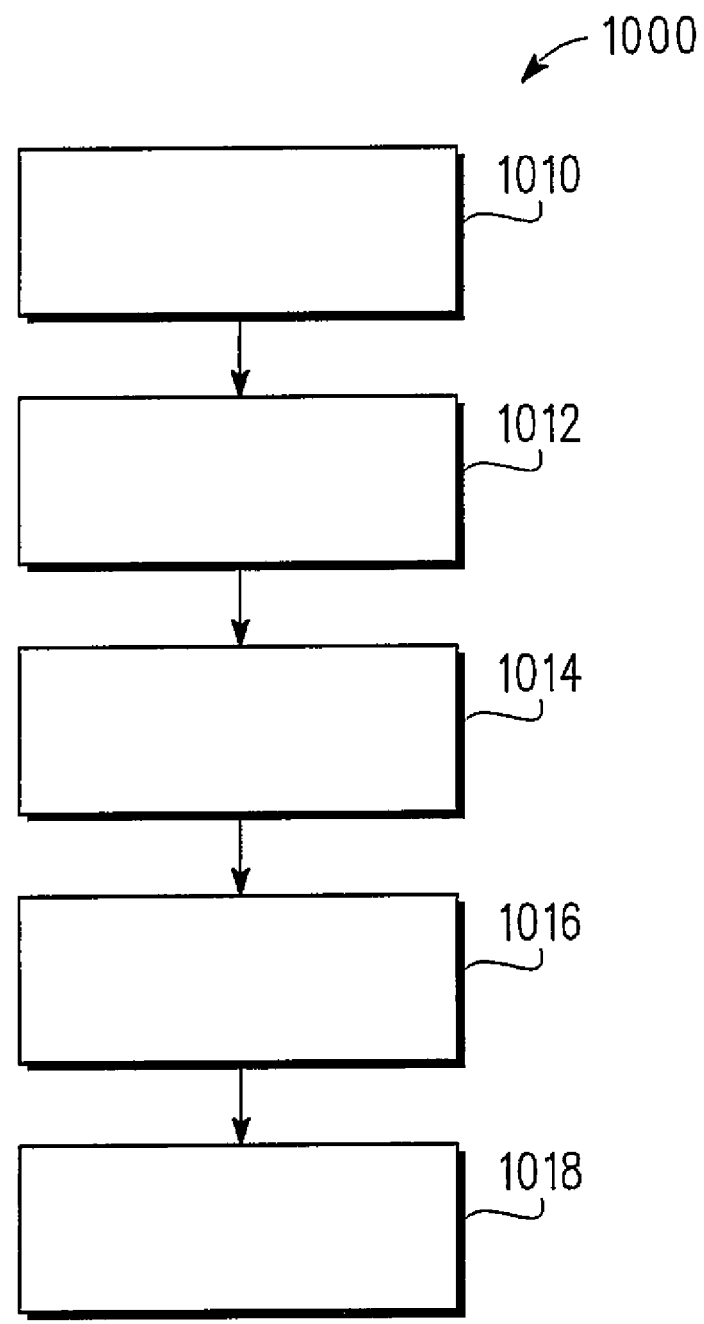
FIG. 10 schematically shows a flowchart illustrating an example of an embodiment of a method for compensating a frequency drift of a VCO resonator circuit.

Referring now to FIG. 10, a flowchart schematically illustrates an example of an embodiment of a method 1000 for compensating a frequency drift of a VCO resonator circuit 230. It may comprise providing 1010 a signal having a frequency, the frequency depending on a tuning voltage applied to a first plurality of varactors 232, 234 of the VCO resonator circuit, sensing 1012 an ambient temperature of the VCO resonator circuit using a temperature sensor 220 and providing 1014 a temperature dependent signal to a temperature compensation circuit 210, the temperature compensation circuit providing 1016 a compensation voltage depending on the temperature dependent signal, and compensating 1018 a drift of the frequency by varying a capacitance of a second plurality of varactors 236, 238 of the VCO resonator circuit depending on the compensation voltage.

The temperature compensation circuit (210) may have a programmable gain and the step of providing (1016) a compensation voltage may comprise programming the gain.

Furthermore, the step of programming the gain may comprise applying data bits depending on a desired value for the gain to a multiplying digital-to-analog converter (MDAC) (314).

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, indium phosphide, gallium nitride, silicon germanium, silicon-on-insulator (SOI), silicon, monocrystalline silicon, the like, and combinations of the above.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals.

Therefore, many options exist for transferring signals.

Although the discussed VCO circuit only mentions a single VCO, it may contain a plurality of VCOs covering a wider frequency range.

The use of the term "varactor" as used herein, does not exclude any other capacitive devices to be used in combination or instead.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Figure 1:
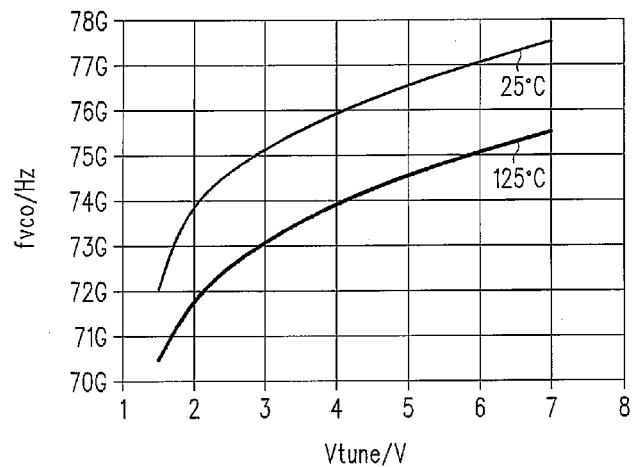
FIG. 1 schematically shows a diagram of an example of an operating frequency of a millimeter wave SiGe-VCO plotted against a tuning voltage at different ambient temperatures.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of circuit 200, 300 are circuitry located on a single integrated circuit or within a same device. Alternatively, system 200, 300 may include any number of separate integrated circuits or separate devices interconnected with each other. Also for example, circuit 200, 300 or portions thereof may be soft or code representations of physical circuitry or of logical representations convertible into physical circuitry. As such, circuit 200, 300 may partly be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A voltage controlled oscillator circuit comprising:
a VCO resonator circuit having a first plurality of varactors for varying a frequency of said VCO resonator circuit, said VCO resonator circuit being symmetrical with respect to VCO circuit ground and providing a signal having a frequency, said frequency depending on a tuning voltage applied to said first plurality of varactors, and a second plurality of varactors for compensating a drift of said frequency depending on a compensation voltage, said second plurality of varactors receiving said compensation voltage from a low pass filter;
a temperature sensor circuit sensing an ambient temperature of said VCO resonator circuit and providing a temperature dependent signal; and
a temperature compensation circuit providing said compensation voltage depending on said temperature dependent signal, wherein said temperature compensation circuit comprises at least one operational amplifier and said compensation voltage is provided to said low pass filter, wherein said temperature compensation circuit has a programmable gain and comprises at least one multiplying digital-to-analog converter (MDAC), the multiplying digital-to-analog converter (MDAC) is connected in a feedback path of a second operational amplifier circuit.

2. The VCO circuit as claimed in claim 1, wherein a resistive loss of said VCO resonator circuit is at least partly compensated using a negative impedance stage.

3. The VCO circuit as claimed in claim 1, wherein said operational amplifier comprises transistors built as NPN transistors only.

4. The VCO circuit as claimed in claim 1, wherein said VCO resonator circuit and said temperature sensor circuit are subject to the same temperature changes.

5. The VCO circuit as claimed in claim 1, wherein said VCO resonator circuit, said temperature sensor circuit and said temperature compensation circuit are provided as a monolithically integrated circuit built on the same chip.

6. The VCO circuit as claimed in claim 1, wherein said VCO circuit is operable in a frequency range above 15 GHz.

7. A phase locked loop (PLL) circuit comprising a VCO circuit as claimed in any of claim 1.

8. An automotive radar device comprising a VCO circuit as claimed in claim 1 or a PLL circuit as claimed in claim 7 controlling a temperature compensated VCO circuit.

9. A method for compensating a frequency drift of a VCO resonator circuit, comprising:
  providing a signal having a frequency, said frequency depending on a tuning voltage applied to a first plurality of varactors of said VCO resonator circuit; sensing an ambient temperature of said VCO resonator circuit using a temperature sensor circuit;
  providing a temperature dependent signal to a temperature compensation circuit comprising a first operational amplifier, said temperature compensation circuit providing a compensation voltage depending on said temperature dependent signal to a low pass filter; and
  compensating a drift of said frequency by varying a capacitance of a second plurality of varactors of said VCO resonator circuit depending on said compensation voltage received from said low pass filter;
  wherein the temperature compensation circuit has a programmable gain and wherein the step of providing a compensation voltage comprises programming said gain applying data bits depending on a desired value for said gain to a multiplying digital-to-analog converter (MDAC) in a feedback path of a second operational amplifier circuit.

10. The VCO circuit as claimed in claim 2, wherein said operational amplifier comprises transistors built as NPN transistors only.

11. The VCO circuit as claimed in claim 2, wherein said VCO resonator circuit and said temperature sensor circuit are subject to the same temperature changes.

12. The VCO circuit as claimed in claim 2, wherein said VCO resonator circuit, said temperature sensor circuit and said temperature compensation circuit are provided as a monolithically integrated circuit built on the same chip.

13. The VCO circuit as claimed in claim 2, wherein said temperature compensation circuit has a programmable gain.

14. The VCO circuit as claimed in claim 3, wherein said temperature compensation circuit has a programmable gain.

15. The VCO circuit as claimed in claim 4, wherein said temperature compensation circuit has a programmable gain.

* * * * *